United States Patent
Jung et al.

(10) Patent No.: US 10,361,275 B2
(45) Date of Patent: Jul. 23, 2019

(54) MULTI-DOPED GRAPHENE AND METHOD FOR PREPARING THE SAME

(71) Applicant: LG ELECTRONICS INC., Seoul (KR)

(72) Inventors: Mynghee Jung, Seoul (KR); Nami Byun, Seoul (KR); Jinsan Moon, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 15/456,421

(22) Filed: Mar. 10, 2017

(65) Prior Publication Data

US 2018/0069082 A1 Mar. 8, 2018

(30) Foreign Application Priority Data

Sep. 7, 2016 (KR) .................. 10-2016-0115130

(51) Int. Cl.
| | |
|---|---|
| *C01B 32/194* | (2017.01) |
| *C01B 32/182* | (2017.01) |
| *B82Y 40/00* | (2011.01) |
| *H01L 29/167* | (2006.01) |
| *H01L 29/16* | (2006.01) |

(52) U.S. Cl.
CPC .......... *H01L 29/167* (2013.01); *C01B 32/194* (2017.08); *H01L 29/1606* (2013.01)

(58) Field of Classification Search
CPC . H01L 29/1606; H01L 29/167; C01B 32/104; C01B 32/182; C01B 32/194; H01B 1/04; H01B 1/14

USPC .................. 252/500, 502, 506, 510; 257/40; 427/255.5, 434.2
See application file for complete search history.

(56) References Cited

U.S. PATENT DOCUMENTS

| | | | |
|---|---|---|---|
| 2011/0127471 A1* | 6/2011 | Shin ...................... | B82Y 30/00 252/506 |
| 2012/0080086 A1 | 4/2012 | Yoon et al. | |

(Continued)

FOREIGN PATENT DOCUMENTS

KR 1020110101081 9/2011

OTHER PUBLICATIONS

PCT International Application No. PCT/KR2017/005006, Notification of Transmittal of the International Search Report and the Written Opinion of the International Searching Authority, or Declaration dated Aug. 28, 2017, 12 pages.

(Continued)

*Primary Examiner* — Tri V Nguyen
(74) *Attorney, Agent, or Firm* — Lee, Hong, Degerman, Kang & Waimey (57) ABSTRACT

A graphene doped with different dopants and a method for preparing the same are disclosed. A method for preparing a multi-doped graphene includes: mixing a metal-based dopant and at least one organic-based dopant to prepare a doping solution; stacking a graphene layer on a substrate; and doping the graphene layer with the doping solution that includes the metal-based dopant and the at least one organic-based dopant. The method allows maintaining the transparency of the prepared graphene and minimizing the sheet resistance of the graphene while not damaging a substrate on which the graphene is stacked.

4 Claims, 7 Drawing Sheets

(56) References Cited

U.S. PATENT DOCUMENTS

2012/0270054 A1\* 10/2012 Hong .................. B29B 15/08
                                                    428/408
2014/0110670 A1\* 4/2014 Yoon ................. H01L 29/1606
                                                    257/29
2015/0162408 A1   6/2015 Hong et al.

OTHER PUBLICATIONS

Denis, Pablo A. et al., "Dual doped monolayer and bilayer graphene: The case of 4p and 2p elements," Chemical Physics Letters, Elsevier B.V., Jun. 2016, 6 pages.

Toh, Rou Jun et al., "Transition Metal (Mn, Fe, Co, Ni)-Doped Graphene Hybrids for Electrocatalysis," Wiley Online Library, DOI: 10.1002/asia.201300068, Mar. 2013, 6 pages.

\* cited by examiner

MULTI-DOPED GRAPHENE AND METHOD FOR PREPARING THE SAME

CROSS-REFERENCE TO RELATED APPLICATIONS

Pursuant to 35 U.S.C. § 119(a), this application claims the benefit of earlier filing date and right of priority to Korean Patent Application No. 10-2016-0115130 filed on Sep. 7, 2016, the contents of which are hereby incorporated by reference herein in its entirety.

BACKGROUND OF THE DISCLOSURE

1. Field

The present invention relates to a graphene doped with different dopants and a method for preparing the same.

2. Background

Graphitic carbon materials including fullerene, carbon nanotubes, and graphene as nano-materials composed only of carbon atoms have received much attention from the academic world and industries for their excellent electrical properties, and physical and chemical stability.

In particular, graphene is a material which has come into the spotlight as an epoch-making new material due to the very high specific area compared with the volume, excellent electric conductivity, and physical and chemical stability.

Meanwhile, studies have been experimentally conducted on doping into carbon lattices for several years. Doping is a process which may improve electrical properties such as sheet-resistance and charge mobility of graphene. When previous studies related to doping are reviewed, there are largely two methods, and examples thereof include a method in which doping is performed while graphene is synthesized, a method of modifying the material after graphene is synthesized, and the like.

In particular, in order to reduce the sheet resistance of graphene in the related art, a technology of doping graphene with a metal-based dopant or an organic-based dopant has been used.

Figure 1A:
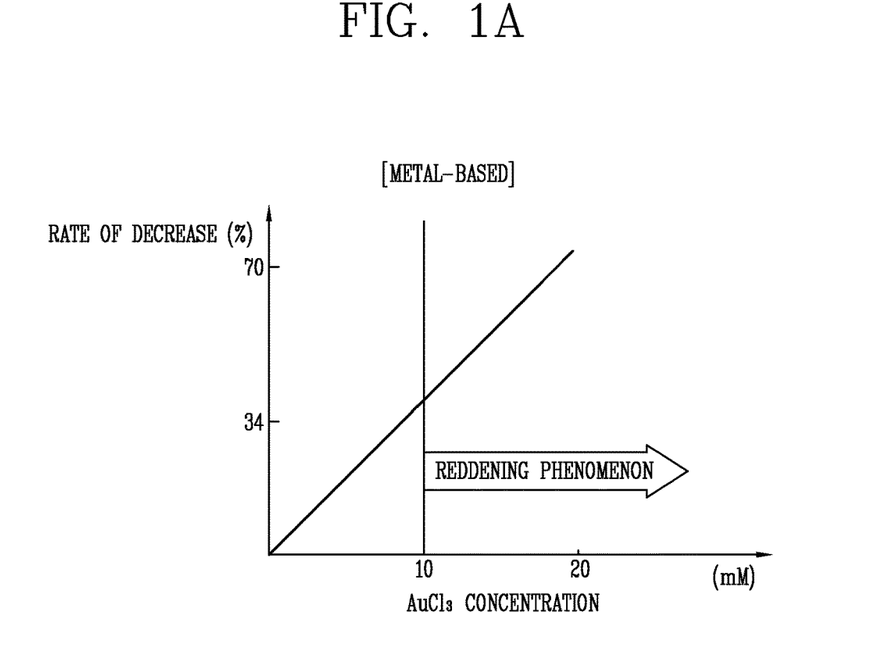
FIGS. 1A to 1D are graphs showing a rate of decrease in graphene sheet resistance according to the concentration of a doping solution when graphene is doped with any one of a metal-based dopant and an organic-based dopant.
Figure 1B:
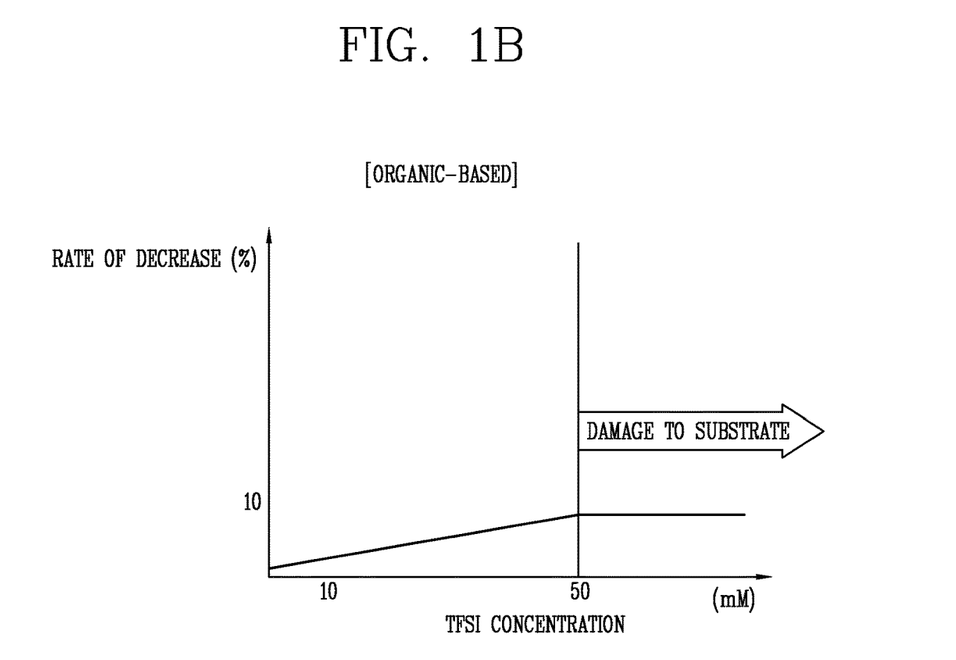

Referring to FIGS. 1A and 1B, there is a problem in that when graphene is doped with a predetermined amount or more of a metal-based dopant, graphene becomes reddened. Further, there is a problem in that when graphene is doped with a predetermined amount or more of an organic-based dopant, graphene and a substrate supporting graphene are damaged.

Figure 1C:
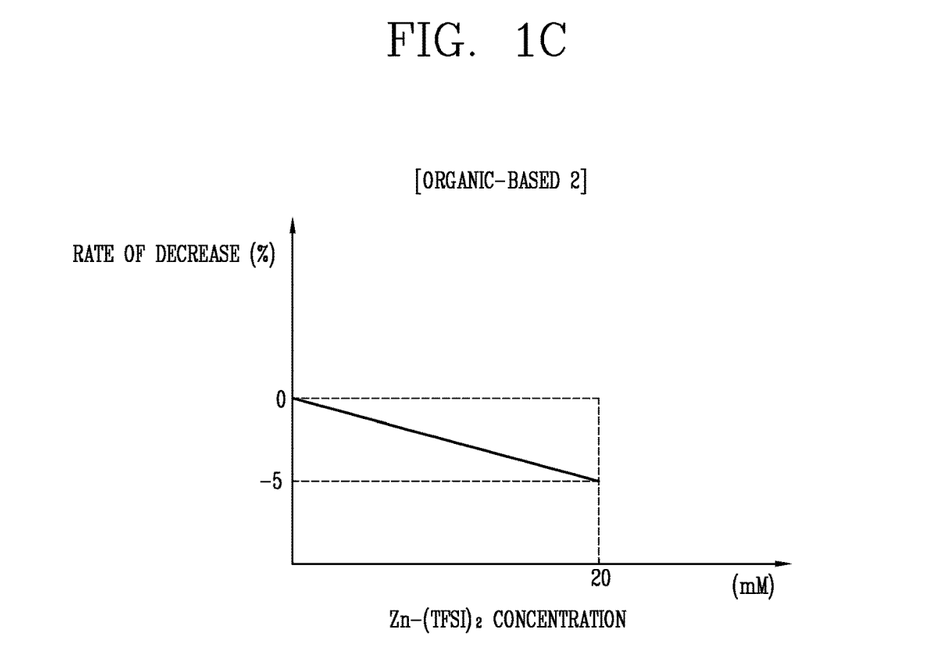
Figure 1D:
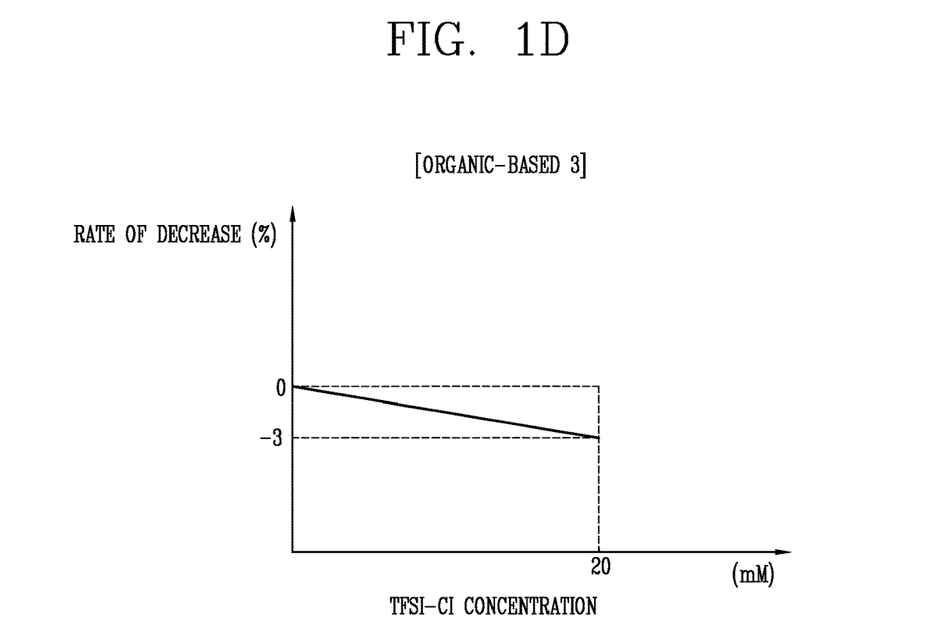

Meanwhile, referring to FIGS. 1C and 1D, there is a problem in that when graphene is doped with a specific organic-based dopant, the sheet resistance of graphene is rather increased.

Due to the above-described problems, there is a limitation in reducing the sheet resistance of graphene through doping.

SUMMARY OF THE DISCLOSURE

Therefore, an aspect of the detailed description is to provide a graphene doping method that may prevent a reddening phenomenon which may occur due to a metal-based dopant, may minimize the damage of a substrate, which may occur due to an organic-based dopant, and may simultaneously minimize the sheet resistance of graphene. Another aspect of the detailed description is to provide a multi-doped graphene.

The present disclosure provides a method for preparing a multi-doped graphene, the method including: mixing a metal-based dopant and at least one organic-based dopant to prepare a doping solution; stacking a graphene layer on a substrate; and doping the graphene layer with the doping solution that includes the metal-based dopant and the at least one organic-based dopant.

Further, the present disclosure provides a multi-doped graphene including a substrate; and a graphene layer formed on the substrate and doped with a metal-based dopant and an organic-based dopant. In one aspect of the present invention, the multi-doped graphene may be prepared by the above described method.

According to the present disclosure, it is possible to maintain the transparency of graphene and minimize the sheet resistance of graphene while not damaging a substrate on which the graphene is stacked.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

DETAILED DESCRIPTION OF THE DISCLOSURE

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Prior to explaining a multi-doped graphene according to the present invention and a method for preparing the same, a rate of decrease in sheet resistance of a single-doped graphene will be explained.

The following Table 1 shows a rate of decrease in sheet resistance of graphene when the graphene is doped with a dopant solution having a predetermined concentration.

Referring to Table 1, when graphene is doped by using a metal-based dopant $AuCl_3$ and an organic-based dopant bis(trifluoromethanesulfonyl)imide, the higher the concentration of the dopant solution is, the higher the rate of decrease in sheet resistance of graphene is.

However, when graphene is doped with $AuCl_3$ at a concentration of 10 mM or more, a reddening phenomenon occurs, and when graphene is doped with a bis(trifluoromethanesulfonyl)imide solution at a concentration of 150 mM, a substrate is damaged by the dopant.

Meanwhile, when graphene is doped with zinc di[bis(trifluoromethylsulfonyl)imide] and trifluoromethanesulfonyl chloride, the sheet resistance is rather increased.

TABLE 1

| High concentration | $AuCl_3$ | (bis(trifluoromethanesulfonyl)imide) | Zinc di[bis(trifluoromethylsulfonyl)imide] | Trifluoromethanesulfonyl chloride |
|---|---|---|---|---|
| Concentration | 20 mM | 20 mM | 20 mM | 20 mM |
| Rate of decrease | 70% | 10% | Increased by 5% | Increased by 3% |
| Others | When the concentration of $AuCl_3$ is 10 mM or more, the rate of decrease is up to 70% or more, but the reddening phenomenon occurs | When the graphene support layer is at a high concentration of 150 mM or more, the substrate is damaged by TFSI | | |

According to Table 1, when graphene is doped with one dopant, the sheet resistance cannot be lowered to a predetermined level or less. In order to solve the above-described problem, one of embodiments of the present invention involves minimizing the sheet resistance of graphene by doping graphene with different dopants all together.

Hereinafter, a method for preparing a multi-doped graphene according to an embodiment of the present invention will be described with reference to the accompanying drawings.

Figure 2:
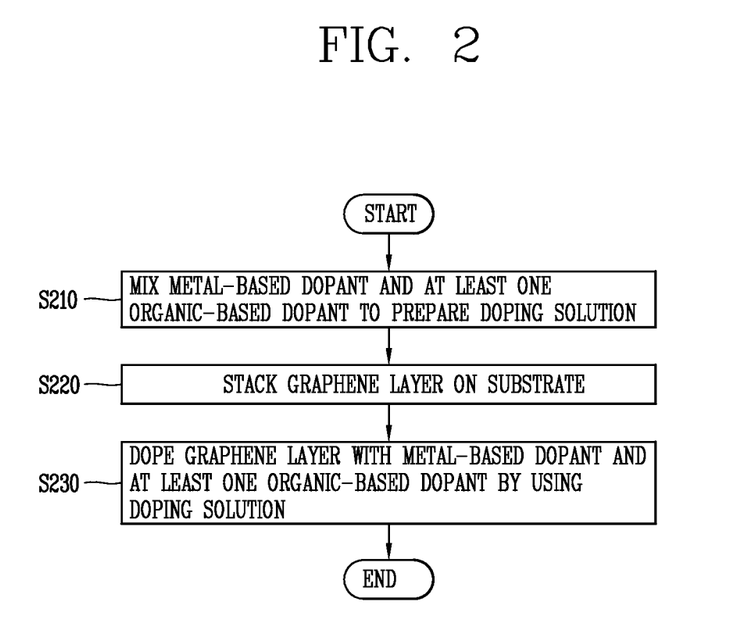
FIG. 2 is a flowchart showing a method for preparing a multi-doped graphene according to an embodiment of the present invention.

FIG. 2 is a flowchart showing a method for preparing a multi-doped graphene according to an embodiment of the present invention.

First, a step (S210) of mixing a metal-based dopant and at least one organic-based dopant is performed to prepare a doping solution. Graphene is doped with a metal-based dopant and an organic-based dopant all together. At this time, one metal-based dopant is used, and at least one organic-based dopant may be used.

The metal-based dopant may be any one of $AuCl_3$, $HAuCl_4$, $FeCl_3$, Ag compounds, Au compounds, or Pt compounds.

The organic-based dopant may be at least one of bis(trifluoromethanesulfonyl)imide, bis(trifluoromethane)sulfonimide, silver(I) bis(trifluoromethanesulfonyl)imide, zinc di[bis(trifluoromethylsulfonyl)imide], trifluoromethanesulfonyl chloride, 1-(trifluoromethanesulfonyl)imidazole, N-(2-pyridyl) bis(trifluoromethanesulfonimide), bis(trifluoromethanesulfonyl)methane, N-(5-chloro-2-pyridyl)bis(trifluoromethanesulfonimide), N-phenyl-bis(trifluoromethanesulfonimide), methyl trifluoromethanesulfonate, trifluoromethanesulfonic anhydride, trifluoromethanesulfonamide, ethyl trifluoromethanesulfonate, zinc trifluoromethanesulfonate, tetracyanoethylene, 2,3,5,6-tetrafluoro-7,7,8,8-tetracyanoquinodimethane, potassium tetrafluoroborate, ammonium tetrafluoroborate, or ammonium hexafluorophosphate.

A solvent for the doping solution may be an organic solvent. For example, as the solvent, nitro methane, nitro benzene, or the like may be used.

As the metal-based dopant, $AuCl_3$ may be used, and as the organic-based dopant, bis(trifluoromethanesulfonyl)imide may be used. At this time, the metal-based dopant may have a concentration of 1 to 10 mM, and the organic-based dopant may have a concentration of 1 to 100 mM.

As the metal-based dopant, $AuCl_3$ may be used, and as the organic-based dopant, any one of zinc di[bis(trifluoromethylsulfonyl)imide] or trifluoromethanesulfonyl chloride may be used. At this time, the metal-based dopant may have a concentration of 1 to 10 mM, and the organic-based dopant may have a concentration of 1 to 200 mM.

According to an embodiment of the present invention, one metal-based dopant and two or more organic-based dopants may be mixed together in the doping solution.

For example, the doping solution may be composed of a mixture of a metal-based dopant, a first organic-based dopant, and a second organic-based dopant. In one example, $AuCl_3$ may be used as the metal dopant, bis(trifluoromethanesulfonyl)imide may be used as the first organic-based dopant, and any one of zinc di[bis(trifluoromethylsulfonyl)imide] or trifluoromethanesulfonyl chloride may be used as the second organic-based dopant. At this time, the metal-based dopant may have a concentration of 1 to 10 mM, the first organic-based dopant may have a concentration of 1 to 100 mM, and the second organic-based dopant may have a concentration of 1 to 200 mM.

Meanwhile, apart from preparing the doping solution, a step (S220) of synthesizing a graphene layer on a substrate is performed.

Here, stacking the graphene layer may be performed by a chemical vapor deposition (CVD) method. Meanwhile, in synthesizing the graphene layer, an already known method for preparing a graphene thin film may be utilized without being limited to CVD. Specifically, in the method for preparing a graphene layer, a physical peel method, a chemical peel method, an epitaxial growth method, and the like may be utilized.

In the present specification, as the method for synthesizing a graphene layer, CVD will be explained as an example, but the method is not limited thereto.

Meanwhile, the substrate may vary depending on when doping in a series of steps of synthesizing a graphene layer is performed. Hereinafter, the case of synthesizing a graphene layer using CVD will be explained as an example.

Figure 3A:
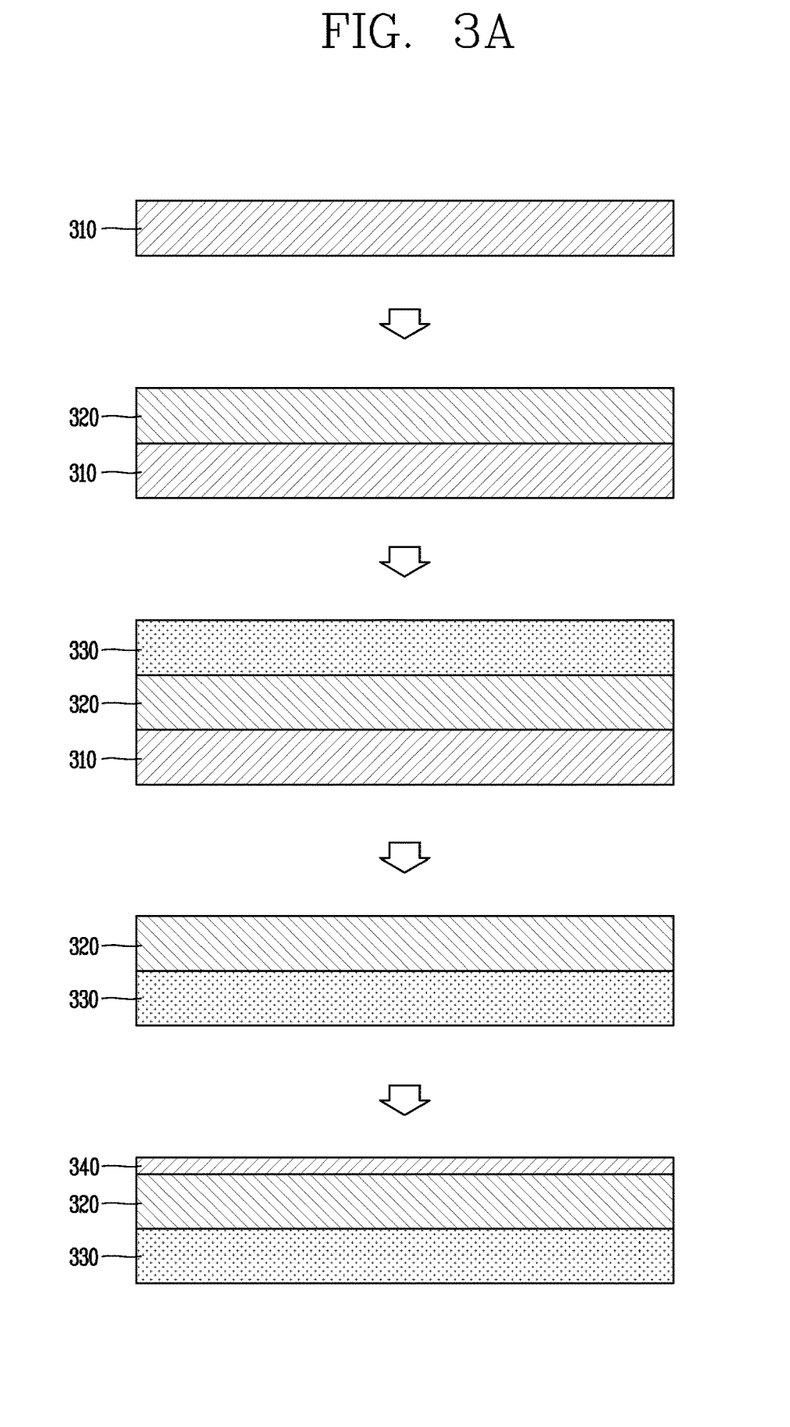
FIGS. 3A and 3B are conceptual views showing a method for preparing a graphene layer using a chemical vapor deposition method according to an embodiment of the present invention.
Figure 3B:
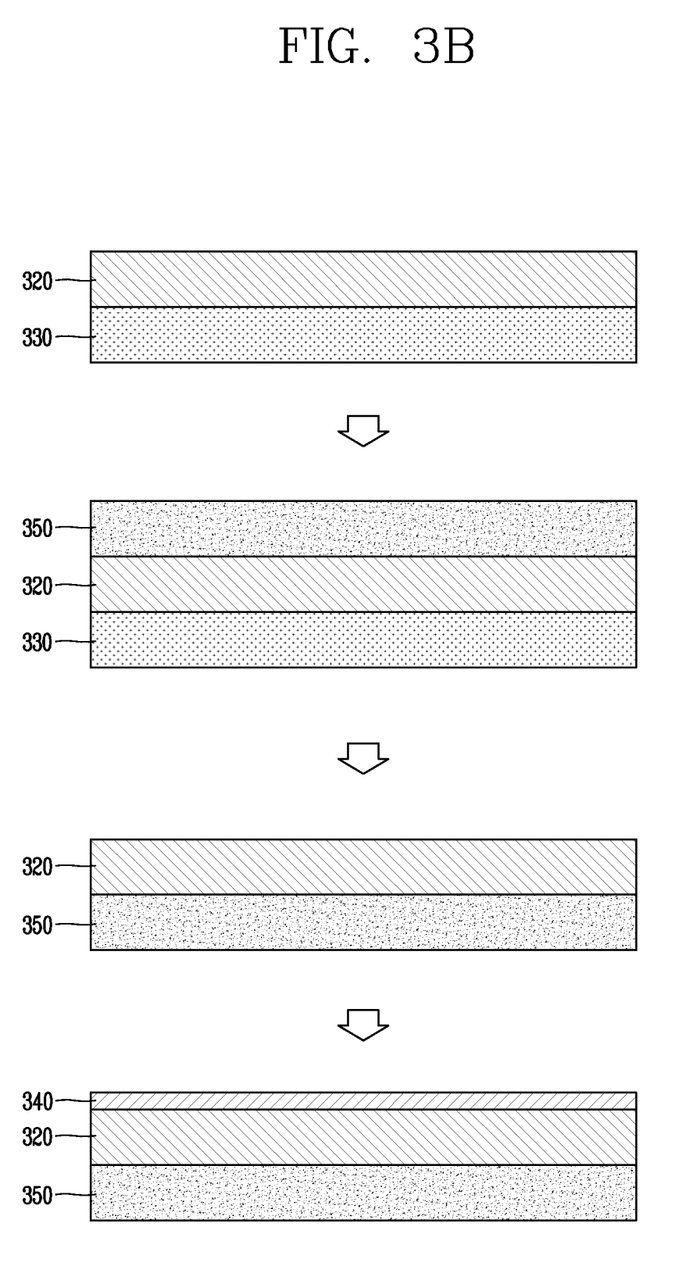

FIGS. 3A and 3B are conceptual views showing a method for preparing a graphene layer using a chemical vapor deposition method.

Referring to FIG. 3A, a graphene layer 320 is synthesized on a predetermined metal layer 310 in the CVD. Here, the predetermined metal serves as a catalyst for synthesizing the graphene layer 320. The predetermined metal may be copper.

Stacking a support layer 330 on the graphene layer 320 is performed. As the support layer 330, a Poly(methyl methacrylate) (PMMA) adhesive film, a UV film, a heat transfer film, and the like may be used.

A support layer 330 is stacked on the graphene layer 320, and then removing the metal layer 310 is performed. At this time, the metal layer 310 may be removed by an etching method, and the like.

The metal layer 310 is removed, and then doping may be performed on the graphene layer 320. In this case, the substrate may be the support layer 330. In FIG. 3A, the doping result is illustrated as one layer 340 for convenience of explanation, but a separate layer may not be produced due to the doping of graphene.

Meanwhile, referring to FIG. 3B, the metal layer 310 is removed, and then a graphene transfer layer 350 may be stacked on the graphene layer 320. Here, the graphene transfer layer 350 may be PET and the like.

Thereafter, the support layer 330 is removed. At this time, the support layer 330 is removed by using acetone, or removed by UV irradiation, or may be removed by adding heat thereto. The method of removing the support layer may vary depending on the material used as the support layer 330.

The support layer 330 is removed, and then a doping 340 may be performed on the graphene layer 320. In this case, the substrate may be the graphene transfer layer. FIG. 3B illustrates the doping result as one layer 340 for convenience of explanation, but a separate layer may not be produced due to the doping of graphene.

Meanwhile, the doping of the graphene layer 320 may be performed immediately after the graphene layer is synthesized on the metal layer 310. In this case, the substrate may be a layer to which the graphene layer 320 is finally transferred.

As described above, doping a graphene layer may be performed at any time after the graphene layer is synthesized.

Next, a step (S230) of doping the graphene layer with the doping solution that includes the metal-based dopant and the at least one organic-based dopant is performed. Here, doping the graphene layer may be performed by any one of a spin coating, an immersion process, or a spray process.

In the case of a spin coating method, a doping solution is applied on a graphene layer in a state where a substrate and the graphene layer are rotated at a high speed. Thereafter, the graphene layer is dried under an air or nitrogen condition.

In the case of an immersion process, the substrate and the graphene layer are immersed in the doping solution, and then dried under an air or nitrogen condition.

In the case of a spray process, the doping solution is sprayed onto the graphene layer by using a spray, and then the graphene layer is dried under an air or nitrogen atmosphere.

Meanwhile, a protective layer may be stacked on the graphene layer on which doping has been completed. The protective layer may be formed so as to protect the graphene layer from mechanical friction, and may be formed so as to prevent oxidation of a material doped on graphene.

Hereinafter, embodiments of the present invention will be described in more detail through the Examples and the Experimental Examples. However, the scope and content of the present invention are not interpreted to be curtailed or limited by the Examples and the Experimental Examples to be described below.

Example 1. Preparation of Double-Doped Graphene

Graphene was prepared by using the above-described method for preparing graphene. At this time, as a dopant, two dopants (one metal-based dopant and one organic-based dopant) were used, and graphene was prepared by varying concentrations of the dopants dissolved in a doping solution.

The following tables show a rate of decrease in sheet resistance of graphene prepared by the above-described method. In the following tables, bis(trifluoromethanesulfonyl)imide is represented by TFSI, zinc di[bis(trifluoromethylsulfonyl)imide] is represented by $Zn\text{-}(TFSI)_2$, and trifluoromethanesulfonyl chloride is represented by TFSI-Cl.

TABLE 2

|  | $AuCl_3$ | TFSI |
|---|---|---|
| Concentration (mM) | 1~10 | 1~100 |
| Rate of decrease | 40~52% | |

TABLE 3

|  | $AuCl_3$ | $Zn\text{-}(TFSI)_2$ or TFSI —Cl |
|---|---|---|
| Concentration (mM) | 1~10 | 1~200 |
| Rate of decrease | 40~52% | |

Referring to Tables 2 and 3, it can be confirmed that when the graphene layer is doped with a metal-based dopant and an organic-based dopant all together, a higher rate of decrease in sheet resistance may be exhibited by using a doping solution even at a lower concentration than that shown in Table 1.

Example 2. Preparation of Triple-Doped Graphene

Graphene was prepared by using the above-described method for preparing graphene. At this time, as a dopant, three dopants (one metal-based dopant and two organic-based dopants) were used, and graphene was prepared by varying concentrations of the dopants dissolved in a doping solution.

The following tables show a rate of decrease in sheet resistance of graphene prepared by the above-described method.

TABLE 4

|  | AuCl$_3$ | TFSI | Zn-(TFSI)$_2$ |
| --- | --- | --- | --- |
| Concentration (mM) | 1~10 | 0.2~100 | 0.2~200 |
| Rate of decrease |  | 50~70% |  |

TABLE 5

|  | AuCl$_3$ | TFSI | TFSI—Cl |
| --- | --- | --- | --- |
| Concentration (mM) | 1~10 | 1~100 | 0.2~200 |
| Rate of decrease |  | 50~70% |  |

Referring to Tables 4 and 5, it can be confirmed that the three dopants have a higher rate of decrease in sheet resistance than those of the two dopants.

Comparative Example. Preparation of Graphene Doped with Two Organic-Based Dopants Graphene was prepared by using the above-described method for preparing graphene. At this time, as the dopant, two organic dopants were used, and graphene was prepared by varying the concentrations of the dopants dissolved in a doping solution.

The following Table 6 shows a rate of decrease in sheet resistance of graphene prepared by the above-described method. According to Table 6, it can be seen that when graphene is doped with the two organic dopants, the rate of decrease in sheet resistance is close to 0.

TABLE 6

|  | TFSI | Zn-(TFSI)$_2$ or TFSI—Cl |
| --- | --- | --- |
| Concentration (mM) | 1~100 | 1~200 |
| Rate of decrease |  | 1~1.5% |

Figure 4:
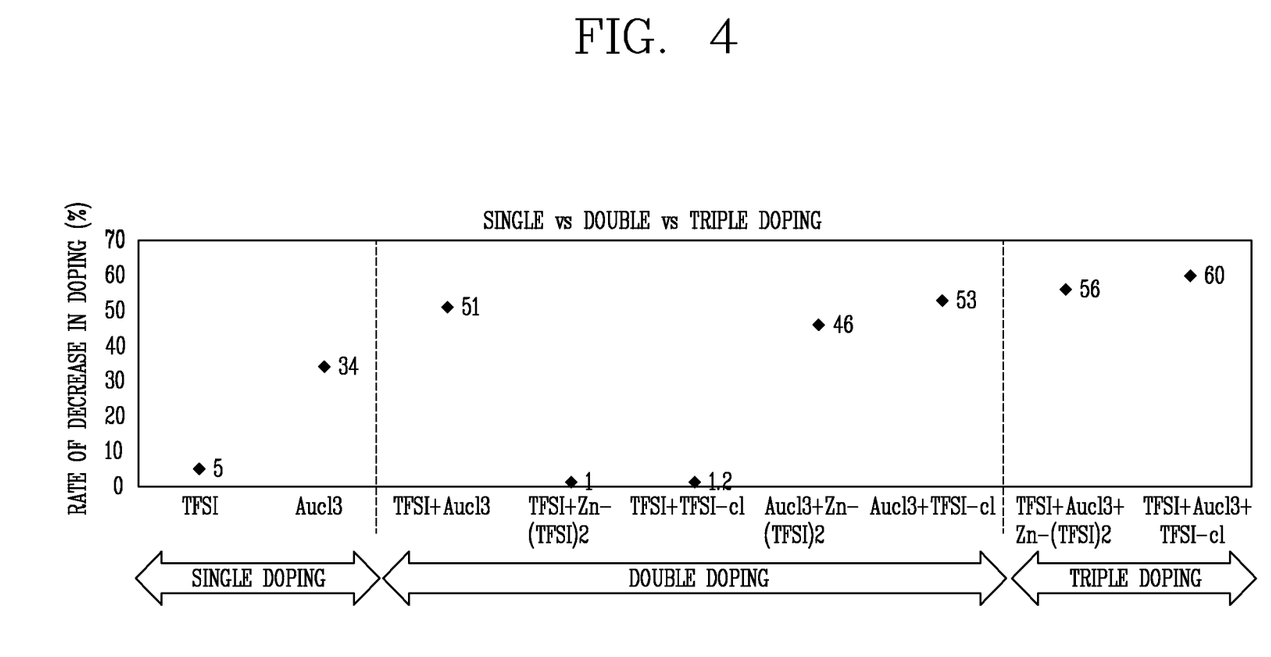
FIG. 4 is a graph showing a rate of decrease in sheet resistance of a doped graphene.

Meanwhile, FIG. 4 is a graph showing a rate of decrease in sheet resistance of graphene during the single doping, the double-doping, and the triple-doping.

Referring to Tables 1 to 5 and FIG. 4, when graphene is doped with a metal-based dopant and at least one organic-based dopant all together, a high rate of decrease in sheet resistance is exhibited even at a relatively low dopant concentration. Accordingly, it is possible to significantly decrease the sheet resistance of graphene and simultaneously prevent the reddening phenomenon and the damage of a substrate according to the doping.

Experimental Example 1. Measurement of Content of Metal in Reduced State Included in Graphene In order to check an effect of an organic-based dopant to dope graphene together with a metal-based dopant, the content of a metal in a reduced state present in doped graphene was measured. For this purpose, graphene of which doping has been completed was analyzed by an X-ray photoelectron spectroscopy (XPS).

Here, the graphene used in the XPS analysis was a graphene single-doped with AuCl$_3$ and a graphene doped with AuCl$_3$ and an organic-based dopant TFSI all together.

Figure 5:
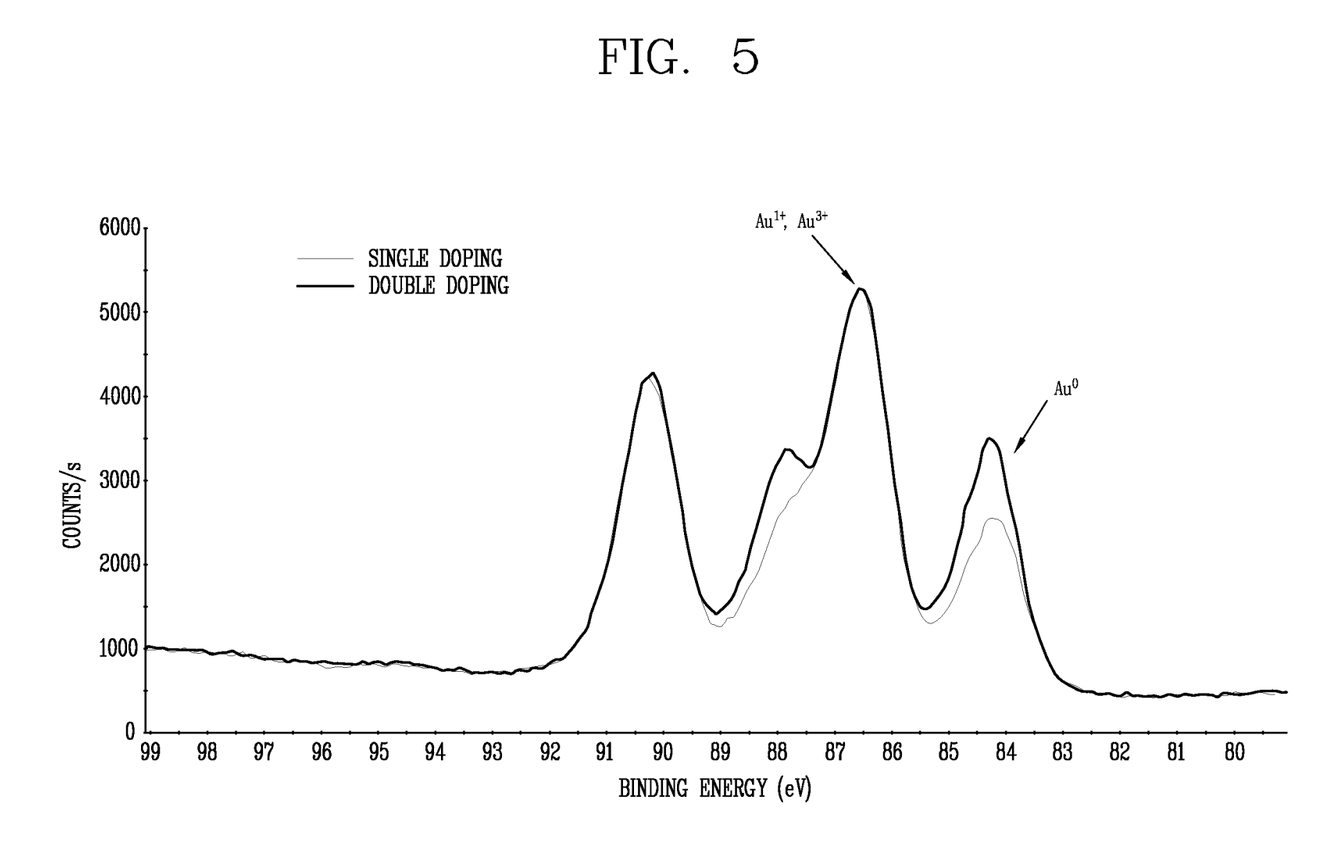
FIG. 5 is a graph showing X-ray photoelectron spectroscopy (XPS) results of the doped graphene.

FIG. 5 is a graph showing the X-ray photoelectron spectroscopy results of single-doped and double-doped graphenes.

Referring to FIG. 5, in the case of graphene single-doped with AuCl$_3$, the content of Au(AuO) in a reduced state was 15.7%. In contrast, in the case of graphene doped with AuCl$_3$ and TFSI all together, the content of AuO was 26.8%.

According to the above-described XPS analysis results, TFSI does not directly work on the graphene, but serves as an assistant to increase the reduction potential of AuCl$_3$, thereby increasing the effect of decreasing the sheet resistance.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A method for preparing a multi-doped graphene, the method comprising:
    mixing a metal-based dopant and at least one organic-based dopant to prepare a doping solution;
    stacking a graphene layer on a substrate; and
    doping the graphene layer with the doping solution that includes the metal-based dopant and the at least one organic-based dopant,
    wherein:
    the doping solution comprises a mixture of the metal-based dopant, a first organic-based dopant, and a second organic-based dopant;
    the metal-based dopant is AuCl$_3$ and a concentration of the metal-based dopant in the doping solution is 1 to 10 mM;
    the first organic-based dopant is bis(trifluoromethanesulfonyl)imide and a concentration of bis(trifluoromethanesulfonyl)imide in the doping solution is 1 to 100 mM;
    the second organic-based dopant is zinc di[bis(trifluoromethylsulfonyl)imide] or trifluoromethanesulfonyl chloride and a concentration of zinc di[bis(trifluoromethylsulfonyl)imide] or trifluoromethanesulfonyl chloride in the doping solution is 1 to 200 mM;
    the prepared multi-doped graphene is not reddened; and
    a rate of decrease in sheet resistance of the multi-doped graphene is 46% to 60%.

2. The method of claim 1, wherein a solvent for the doping solution comprises an organic solvent.

3. The method of claim 2, wherein the organic solvent comprises nitro methane or nitro benzene.

4. A graphene prepared by the method of claim 1.

* * * * *